US012699151B2

(12) United States Patent
Martinez

(10) Patent No.: US 12,699,151 B2
(45) Date of Patent: Aug. 4, 2026

(54) AUXILIARY MULTIPOLAR DEVICE FOR TESTING ELECTRICAL INSTRUMENTS

(71) Applicant: Meliton Angeles Martinez, Oaxaca (MX)

(72) Inventor: Meliton Angeles Martinez, Oaxaca (MX)

( * ) Notice: Subject to any disclaimer, the term of this patent is extended or adjusted under 35 U.S.C. 154(b) by 177 days.

(21) Appl. No.: 18/568,903

(22) PCT Filed: Jun. 6, 2022

(86) PCT No.: PCT/MX2022/050045
§ 371 (c)(1),
(2) Date: Dec. 11, 2023

(87) PCT Pub. No.: WO2022/265487
PCT Pub. Date: Dec. 22, 2022

(65) Prior Publication Data
US 2024/0288510 A1 Aug. 29, 2024

(30) Foreign Application Priority Data

Jun. 17, 2021 (MX) .................. MX/A/2021/007385

(51) Int. Cl.
*G01R 31/56* (2020.01)
(52) U.S. Cl.
CPC .................................. *G01R 31/56* (2020.01)
(58) Field of Classification Search
None
See application file for complete search history.

(56) References Cited

U.S. PATENT DOCUMENTS

| | | | |
|---|---|---|---|
| 6,400,242 B1 * | 6/2002 | Fasano ................. | H01H 71/465 |
| | | | 200/18 |
| 9,370,666 B2 * | 6/2016 | Donnelly ............. | A61N 1/0484 |
| 10,613,116 B2 * | 4/2020 | Cheshmedjiev ... | G01R 1/07328 |

FOREIGN PATENT DOCUMENTS

| | | | | |
|---|---|---|---|---|
| CN | 103688414 A | * | 3/2014 | .......... H01R 9/2491 |
| MX | 2009006492 | | 4/2010 | |
| MX | 2016010099 | | 12/2016 | |
| MX | 2015008995 | | 1/2017 | |
| MX | 2017003187 | | 12/2017 | |

* cited by examiner

*Primary Examiner* — Jermele M Hollington
(74) *Attorney, Agent, or Firm* — Defillo & Associates, Inc; Evelyn A. Defillo

(57) ABSTRACT

An auxiliary multipolar device for testing electrical instruments including a test block (DAPRE) and a test paddle (DIPSE), configurable from 4 to 36 poles, with auxiliary contacts that detect the insertion of the paddle into the block, and a mechanism to activate the short-circuiting of the currents of the primary equipment and to open the contacts on the instrument side independently and uninterruptedly, where the contacts reduce their resistance, the thermal power dissipated, and prolong their useful life, reducing the friction caused by the movement of the tooth of the paddle. The device has a self-locking activation system, which is deactivated by one or more triggers, allowing the insertion and extraction of the paddle in discrete steps, to produce the operating sequence of the contacts, preventing involuntary operations and allowing tests to be performed reliably.

6 Claims, 9 Drawing Sheets

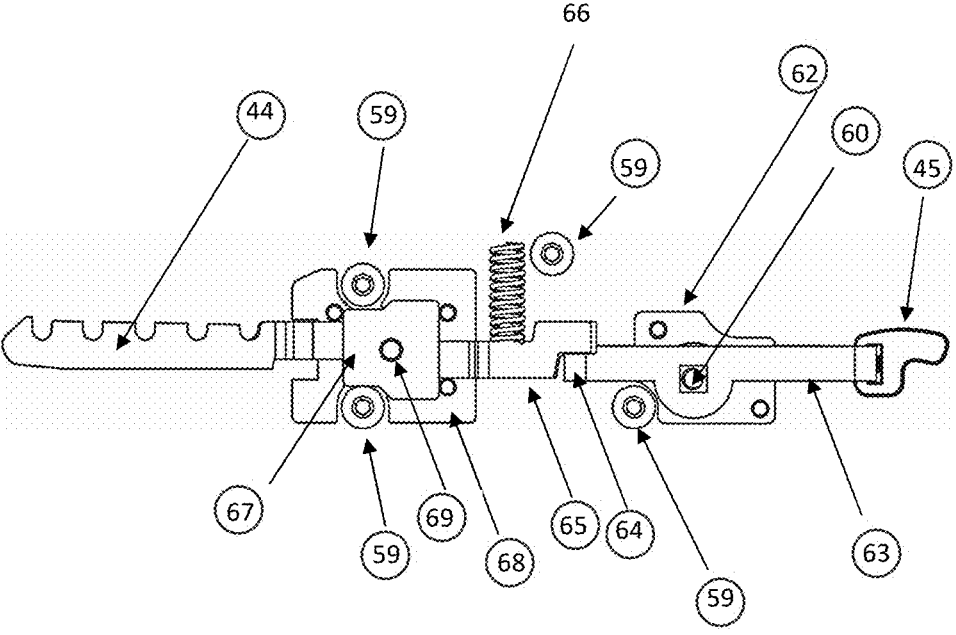
Figure 8-A

AUXILIARY MULTIPOLAR DEVICE FOR TESTING ELECTRICAL INSTRUMENTS

CROSS REFERENCE TO RELATED APPLICATION

This application is a national stage entry of PCT/MX2022/0500045 filed Jun. 6, 2022, under the International Convention and claiming priority over Mexican Patent Application No. MX/a/20221/007385 filed Jun. 17, 2021.

BACKGROUND OF THE INVENTION

An industrial electrical system also known as a power electrical system typically has an open loop control interface, whose inputs are signals from potential transformers and current transformers, whose function is to scale the electrical signals of the power line. medium, high and extra high voltage, to be connected to measuring instruments that work with low and reliable levels of voltage and current; and its control outputs are direct current signals to power the actuators that open the power switches. These actuators are known as trip coils.

Occasionally, maintenance work is required to validate, adjust or reconfigure the instrument parameters. This maintenance must be able to be carried out whether or not the system is in service, so the installations require means that allow opening the interface between the transformers and actuators (Primary Equipment Side) and the measurement and control instruments (Instrument Side); in addition to connecting the instruments to a second auxiliary interface through which operators can inject current and voltage test signals to the instruments and validate the correct operation of the shots.

Its complexity lies in the fact that this switching must be done sequentially and without disturbing the normal operation of the power system when it is in service, since it can produce a false trip order to the switches and affect the operation of the entire system at high costs electrical network. A very common practice is to integrate into the installation a device that is generically called a test block that normally keeps the interface between the primary equipment side and the instrument side closed; which works in conjunction with a second device called a test paddle that serves as the auxiliary interface and which, when inserted into the test block, disconnects the interface between the instrument side and the primary equipment side; and connects the instrument side to the auxiliary interface of the paddle.

The sequence for opening the interface between the primary equipment side and the instrument side consists of the following steps:

1.—interruption of the trigger signals.
2.—Short-circuit the input and return of the current signals on the primary equipment side, since the current signals of a current transformer when opened produce electric arcs that put facilities and human lives at risk, in addition to overload and reduce the useful life of the transformer.
3.—Interruption of the current circuits towards the Instrument side.
4.—Interruption of the potential circuits towards the instrument side.

Currently, the test blocks and paddles on the market work in a similar way, differing in the degree of security both in their normal operation and during the interface change, which is a determining factor in their price. Due to this, the innovations developed are valuable for competitiveness and are described in this patent, which takes reference from applications MX 305808 B and MX 358720 B, which already has auxiliary contacts through micro switches that identify whether the paddle is inserted into the block.

The problems these devices currently face are:

1.—Shorting the input and return of the current signals and interrupting the current signals are dependent actions, since the same movement of the contact terminals on the instrument side is used to carry out both actions, this prevents carrying out the sequence of operation with the required discrete intervals.
2.—The contact terminals have a silver coating on their entire surface that improves their electrical characteristics, which represents high manufacturing costs since they are technically only required at the contact points and the useful life of the contact is limited to wear due to friction suffered by the coating.
3.—The operation sequence must be carried out manually, so it depends on the expertise of user in its handling and is susceptible to errors.
4.—The test blocks are required from 4 to 36 poles, but the architecture of the paddles described in the mentioned patents requires exclusive parts to assemble paddles with a different number of poles, which increases production costs.
5. The signals may be exposed to disturbances due to accidental contact of the operators with the paddle inserted in the block and the block being in service.

SUMMARY OF THE INVENTION

The present invention relates to an auxiliary multipolar device for testing electrical instruments including a test block (DAPRE) and a test paddle (DIPSE), configurable from 4 to 36 poles, with auxiliary contacts that detect the insertion of the paddle into the block, and a mechanism to activate the short-circuiting of the currents of the primary equipment and to open the contacts on the instrument side independently and uninterruptedly, where the contacts reduce their resistance, the thermal power dissipated, and prolong their useful life, reducing the friction caused by the movement of the tooth of the paddle. The device has a self-locking activation system, which is deactivated by one or more triggers, allowing the insertion and extraction of the paddle in discrete steps, to produce the operating sequence of the contacts, preventing involuntary operations and allowing tests to be performed reliably.

BRIEF DESCRIPTION OF THE FIGURES

FIG. 8A. Detailed view of the ratchet and trigger mechanism, showing the pivot axis, the ratchet guiding surface, and the cam surface, which enable the interaction between the trigger, the ratchet, and the locking bolt.

DETAILED DESCRIPTION OF THE INVENTION

Auxiliary device for testing electrical instruments (FIG. 1) based on patent MX 358720 B auxiliary device for testing 24-pole electrical instruments, from which it takes the architecture of alternating type A and type B containers stacked to form a block on the back of which electrical terminals are housed and the sets of contacts for control, current and potential signals can be housed inside; with commercial screws that do not require special tools or special means to be connected, the electrical circuits of the control signals, current and potential are assembled with terminals made of copper sill bonded by copper staples to flexible copper cable; short-circuit bridges are copper sill that cross the current signal chambers of the same group of currents; on the front part it is covered with an element that we have called "bastiplas"; with metal supports at the ends that hold the containers together, and the" bastiplas "to the block, and house the mounting locks to the cabinet; with the lever microswitches placed on the block at the beginning of the paddle guide stroke whose contacts are used to alarm external equipment that the paddle has made contact with the block; The paddle changes its architecture but retains the same characteristics of the teeth to be compatible with blocks from other generations.

Block

Figure 1:
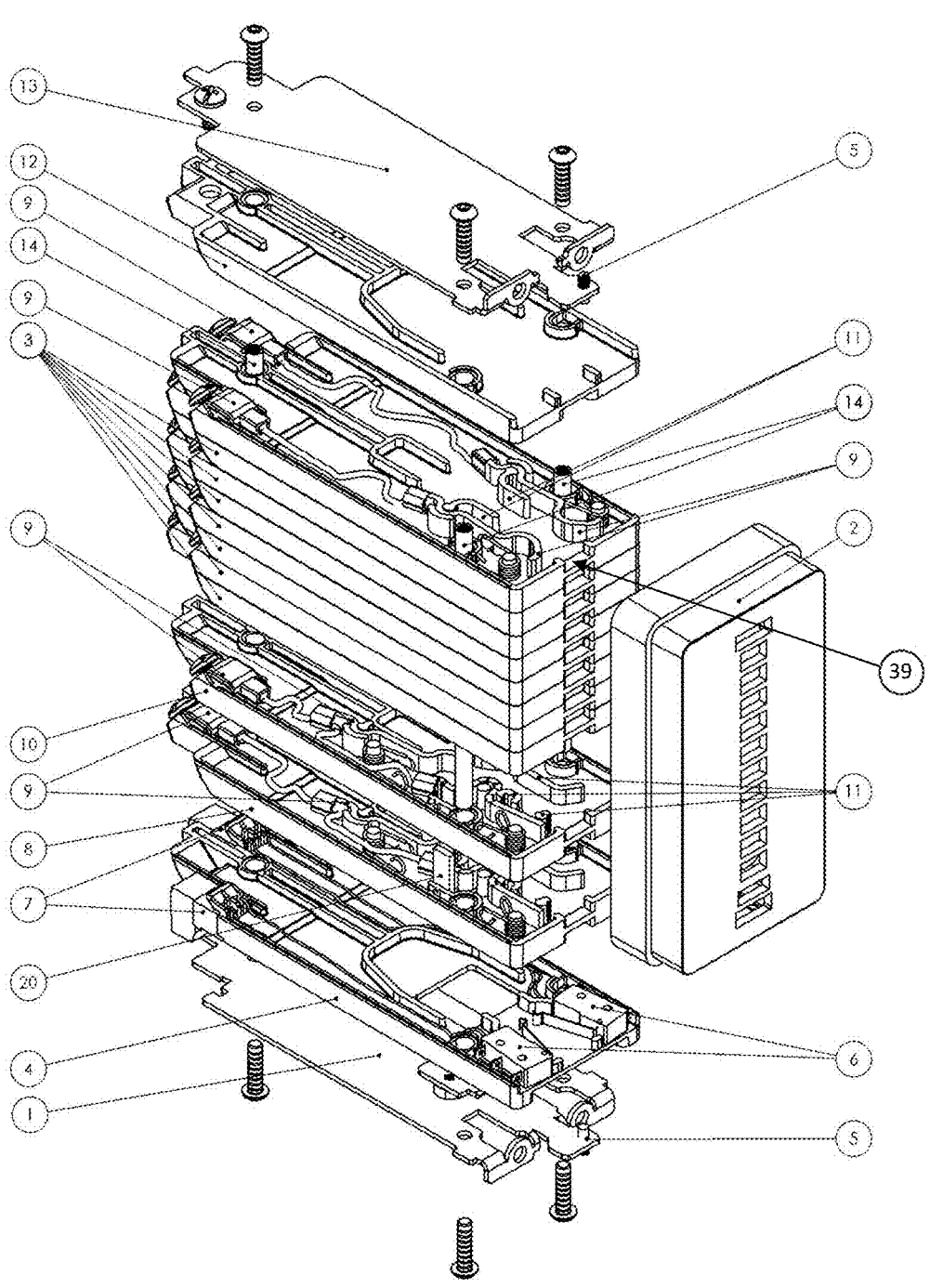
FIG. 1 Exploded view of the multipolar block and its modular containers, showing the lower metal base, the block-base, block-A, block-B and block-top containers, the insulating chambers, and the corridor through which the tooth travels.

According to FIG. 1, the assembly of the block requires a lower metal base (1) that has a fold like tabs with two holes to be fixed by means of screws to the frame or "bastiplas"

(2) and three holes to be screwed to the container assembly (3); followed by a block-base container (4) that with its lower cavity together with the lower metal base (1) forms a chamber that receives and protects the ratchet (44) (FIGS. 7 and 8) of the paddle, where it is It houses a bolt (5) embedded in the lower metal base (1) that serves as an anchor to the ratchet (44) (FIG. 7), and in its upper cavity it houses the auxiliary contact circuit that consists of two micro switches (6) opposing levers that serve as presence sensors of the guide (48) (FIG. 7) of the paddle when it is inserted into the block and whose terminals are each connected to bipolar plug-in type connectors (7); a block-A container (8) superimposed on the block-base type container (4) that with its lower cavity complements the housing chamber for the auxiliary contacts and its upper cavity serves to receive the first set of electrical contacts (9); a block-B container (10) superimposed on the block-A container (8) with its lower cavity complements the housing chamber of the first set of electrical contacts (9) and in its upper cavity serves to house the second set of electrical contacts (9); The containers can be stacked alternating between block-A (8) and block-B (10) to form from 2 to 36 chambers, each of these chambers serves as housing for a single set of electrical contacts (9) called pole, which conduct a single signal, be it a control contact (a) (FIG. 6), a current contact (b) (FIG. 6) or a potential contact (c) (FIG. 6), this allows the assembly of multipolar blocks with all possible combinations of contact types, each combination is called a configuration—The window (39) is a fixed structural opening of the block that guides, aligns, and mechanically supports the initial insertion of the tooth (50) into the corresponding chamber. The window (39) directs the tooth toward the corridor (19), maintains the tooth centered during its travel, and ensures proper engagement with the contact assemblies for control, current, or potential signals. These functional variations do not imply any structural modification of the window (39), which remains the same physical opening shown in FIGS. 1 and 6. The geometries and wall thicknesses of the containers allow maintaining a 2500V insulation that have been tested in the laboratory with 1.5 millimeters of wall thickness. For purposes of the present description, reference is made to the dielectric walls of the containers (4, 8, 10, 12), which define independent insulating chambers capable of withstanding 2500 V between poles. In this arrangement, each pole is housed within an independent insulating chamber defined by the dielectric walls (11) of the block-base container (4), the block-A container (8), the block-B container (10), and the block-lid container (12). The geometry and wall thickness of these containers provide the physical separation between adjacent poles and constitute the structural arrangement by which each pole maintains electrical insulation up to 2500 V. These walls and cavities together form the insulating structure associated with each pole. Each block-A (8) and block-B (10) container has walls (11) (FIGS. 1, 2, 3, 4 and 6) that delimit the corridor (19) (FIGS. 2, 3, 4 and 6) of the passage of the teeth and serve to restrict the lateral movement of the paddle; To close the chamber of the last set of electrical contacts (9), the lower cavity of a block-lid container (12) is used and to close a second upper metal base (13) opposite the lower metal base (1) with the same bolt to lock (5) the ratchet (44) (FIG. 7) and with the same holes to be fixed by means of three threaded rods (14) that cross the block from end to end. The "bastiplas" (2) is not modular, so a different "bastiplas" (2) is required for each block with a different number of poles.

The Current Contacts

Figure 2:
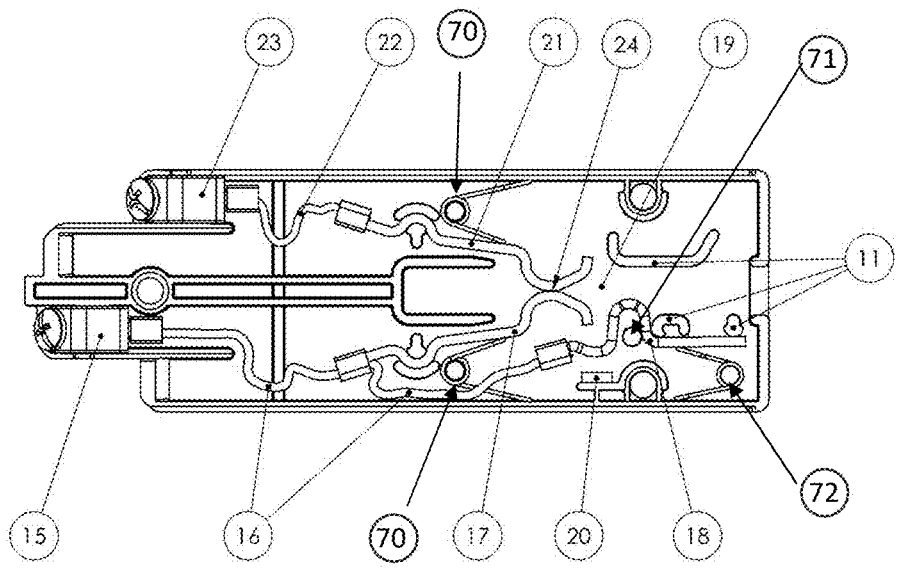
FIG. 2 Detail of a current-signal contact set, including the receiving terminal and the contact terminal on the primary-equipment side, the independent short-circuit contact, the short-circuit bridge, and the springs that bias the terminals toward the tooth corridor.

According to FIG. 2, the primary equipment side receiving terminal (15) is joined to a flexible copper cable (16) that at an intermediate point of its length is joined to the primary equipment side contact terminal (17) The terminals (21), (27) and (28), similarly to the primary contact terminal (17), correspond to contact terminals mounted on torsion springs that press them toward the tooth corridor (19), maintaining mechanical and electrical contact until the tooth separates them. These terminals function as structural means to maintain engagement with the tooth profile, and they are pushed toward the tooth corridor (19) by torsion springs (70). The terminals remain supported against the tooth corridor throughout the insertion and extraction process, ensuring electrical continuity as long as the test sequence has not been activated. The primary contact terminal (17) is connected at its opposite end to a short-circuit terminal (18). The primary equipment-side contact terminal (17) is joined As shown in FIG. 2, the U-shaped geometry of the short-circuit terminal (18), mounted around an embedded pivot pin (71) and associated with a torsion spring (72), constitutes the structure that enables it to perform a combined linear and rotational movement toward the short-circuit bridge (20) when pushed by the tooth (50). The short-circuit terminal (18) is mounted on the embedded pivot pin (71), which acts as the support point and rotational axis for the contact. The terminal (18) is urged toward the short-circuit bridge (20) by the torsion spring (72), allowing it to move within its cavity following a trajectory that combines linear and rotational motion. The cooperation between the embedded pivot pin (71) and the torsion spring (72) defines the kinematics of the terminal (18), enabling its controlled approach toward the tooth corridor (19) as the tooth advances. This mechanical arrangement constitutes the structure through which the short-circuit terminal (18) performs its guided displacement within the container until it reaches and contacts the short-circuit bridge (20), thereby establishing the short-circuit connection between elements (20) and (18). The primary equipment side contact terminal (17) makes contact with the instrument side contact terminal (21) which is also actuated by a torsion spring towards the tooth corridor (19), it is attached to flexible copper cable (22) which in turn joins the instrument side receiving terminal (23), in normal state the contact point (24) of both terminals is performed in a surface region that is a silver inlay (32) (FIG. 5) whose profile is equidistant with the geometric profile (33) (FIG. 5) of the copper sill that forms both contacts, which at the same time serves to create friction with the profile of the tooth that, when moving, separates and insulates them electrically.

Control and Potential Contacts

Figure 3:
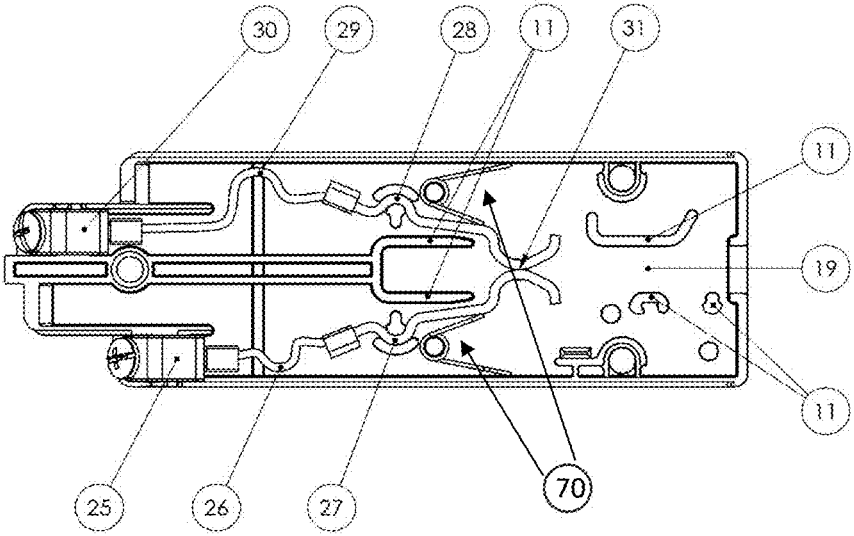
FIG. 3 Detail of a potential-signal/contact set, including the receiving and contact terminals, the torsion spring, and their interaction with the tooth within the corridor, FIG. 4 Detail of a control-signal/contact set, including the receiving and contact terminals and their alignment with the corridor.
Figure 4:
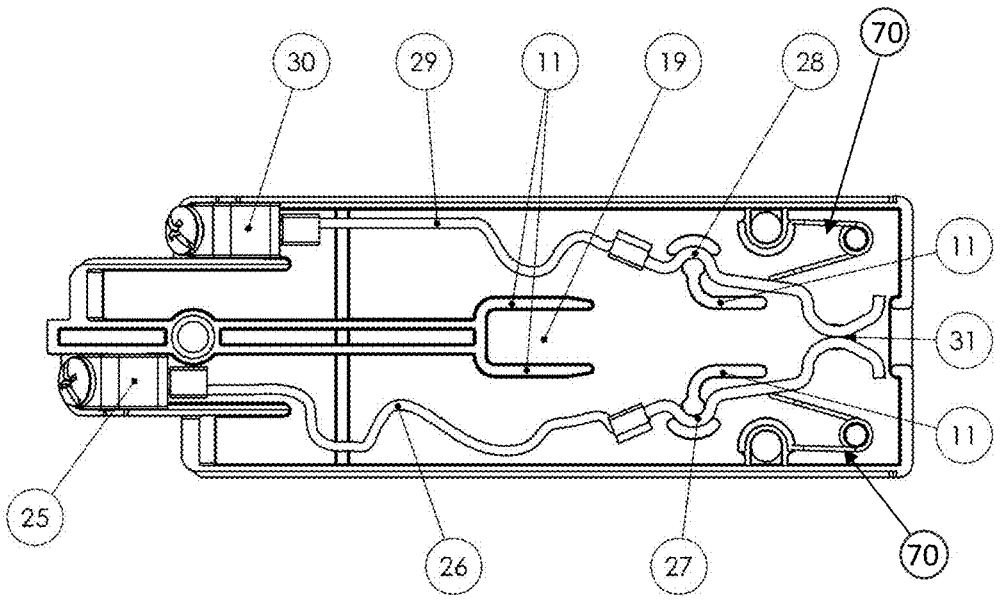

According to FIGS. 3 and 4, the receiving terminal on the primary equipment side (25) is attached to a flexible copper cable (26) and is attached to the contact terminal on the primary equipment side (27), which is activated by a torsion spring in direction to the tooth corridor (19) to make contact with the instrument side contact terminal (28) which is also actuated by a torsion spring towards the tooth corridor (19), is attached to a flexible copper cable (29) which in turn joins the instrument side receiving terminal (30), both terminals have a silver inlay (32) (FIG. 5) at their contact point (31) and their interaction with the tooth is equivalent to described for current terminals.

Contact Points

Figure 5:
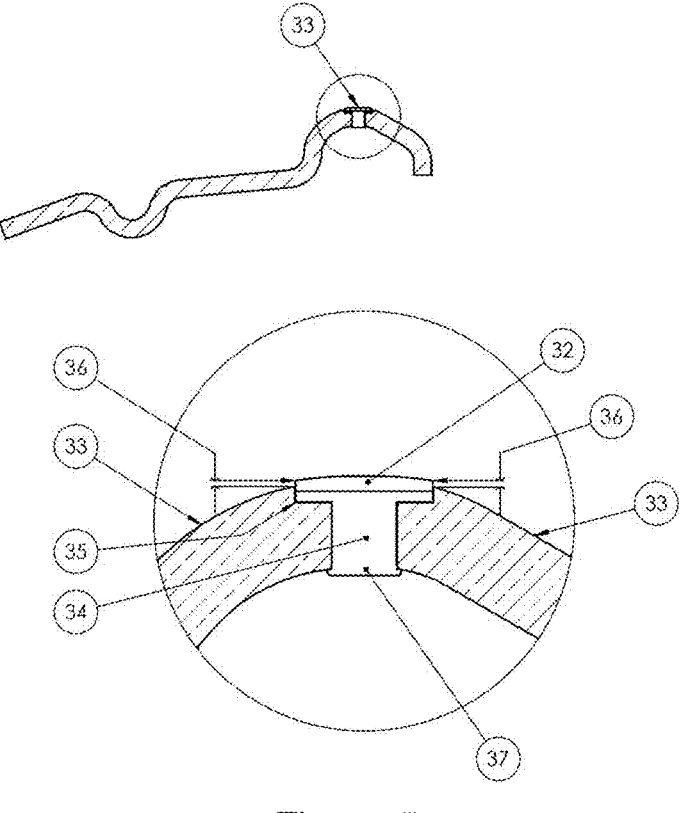
FIG. 5 View of the contact interface between terminals, showing the silver inlay, the contact geometry, the bimetallic rivet, and its shank secured by the closing head.

According to FIG. 5, a method of inlaying silver (32) at the contact point (24) (FIG. 2) (31) (FIGS. 3 and 4). The bimetallic rivet (34), which constitutes the rivet shank, passes through the terminal and is secured by a closing head (37). The rivet, made of a copper shank with a silver head, is embedded in a housing box (35) that receives the silver head. The rivet includes a shank that traverses the full thickness of the copper bar forming the terminal, and the opposite end of the shank is secured by a closing head (37) produced by deforming the material. The closing head fixes the shank within the terminal and maintains the silver head stably positioned inside the housing box (35), ensuring the integrity of the contact surface during operation so that the profile of the head protrudes a distance less than 0.5 mm from the geometric profile (33) of the terminals and the point of contact point is always silver with silver, the equidistance of both profiles is referred to as life of the contact (36) whose wear is caused by the friction of the tooth; and the tailstock of the rivet is forged at both ends (37) to ensure that it is secured in the copper sill.

Operation Sequence

Figure 6:
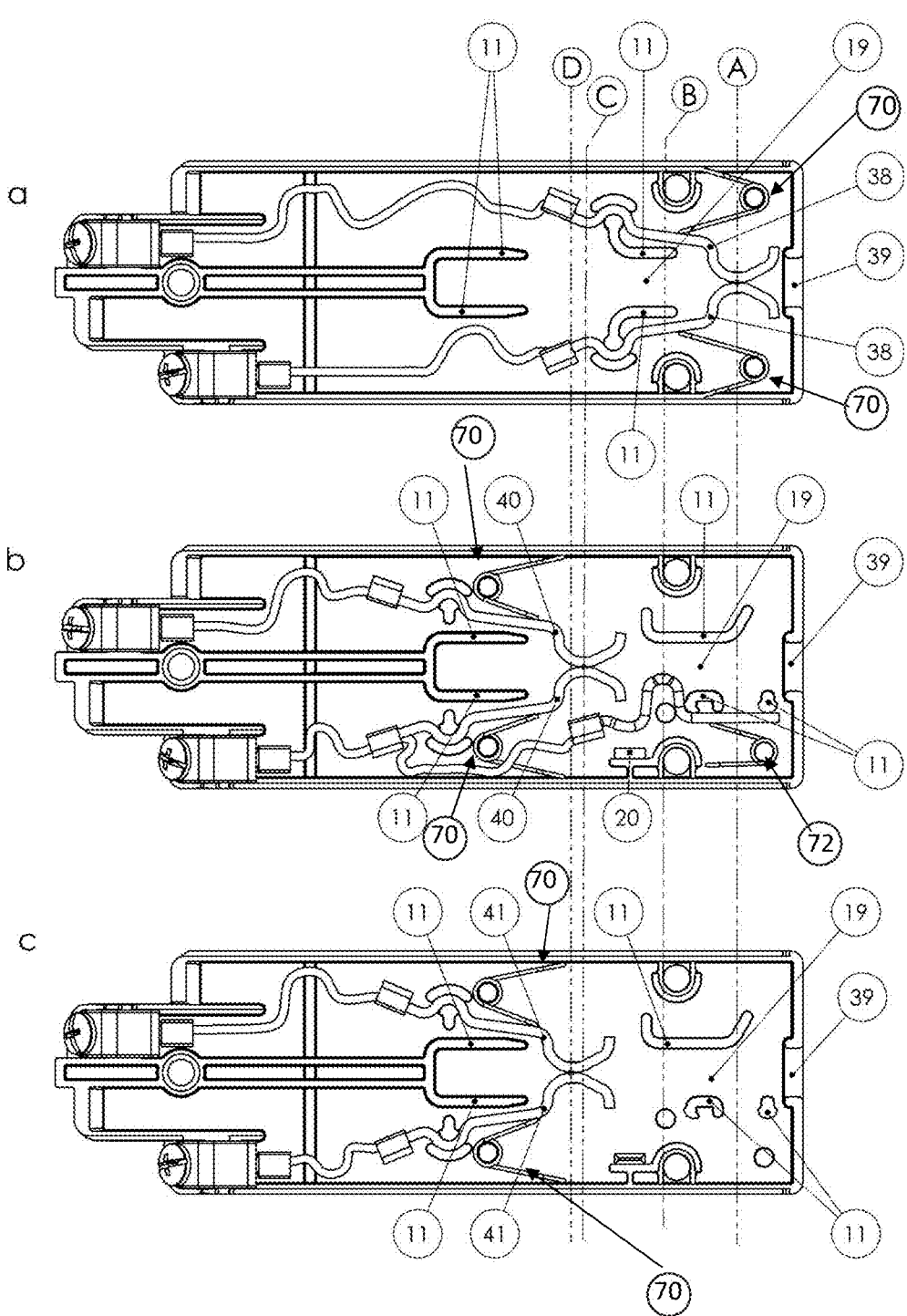
FIG. 6*a* shows a comparative diagram of positioning of the current and potential trigger contacts along the tooth displacement corridor showing a secondly the short contacts, elements (18) and (20) close when the tooth crosses the line.
FIG. 6*b* shows a comparative diagram of positioning of the current and potential trigger contacts along the tooth displacement corridor showing a thirdly the current contacts (40) are opened when the tooth crosses the line.
FIG. 6*c* shows a comparative diagram of positioning of the current and potential trigger contacts along the tooth displacement corridor showing a fourthly the potential contacts (41) are opened when the tooth crosses the line (D) at the end of the corridor (19)

According to FIG. 6, the contact terminals of the control signals (a), current (b) and potential (c) are arranged along the corridor (19) through which the paddle tooth (50) (FIG. 7) moves to produce the required sequence by advancing the tooth: the control contacts (38) are firstly open the control contact (31) opens when the control terminals (27, 28) are separated as the tooth crosses line (A). Secondly, the short-circuit contact closes when the short-circuit terminal (18) makes contact with the short-circuit bridge (20), which is formed by a conductive bar that extends transversely across the current chambers. When the short-circuit terminal (18) is pressed against it, the bar electrically connects the associated current signals before the main current contact (24) is opened. As shown in FIG. 2, the rigid conductive bar extends transversely through the current chambers of the container. Its geometry allows the bar to pass through several dielectric cavities so that, when it is pressed by the independent short-circuit terminal (18), it establishes a common electrical connection among the current signals housed in those chambers. The bar (20) is firmly secured within the container and defines the contact surface onto which the short-circuit arm (18) closes the circuit in a controlled manner before the main terminals open. This structural arrangement ensures that the short-circuit bridge remains fixed while the terminal (18) moves toward it under the action of the tooth (50). When the tooth crosses line (B), third, the current contact (24) opens as the current terminals (40), (17, 21) are separated when the tooth crosses line (C). Fourth, the potential contact (31) opens when the potential terminals (41) are separated as the tooth crosses line (D), at the end of the corridor (19).

Paddle

Figure 7:
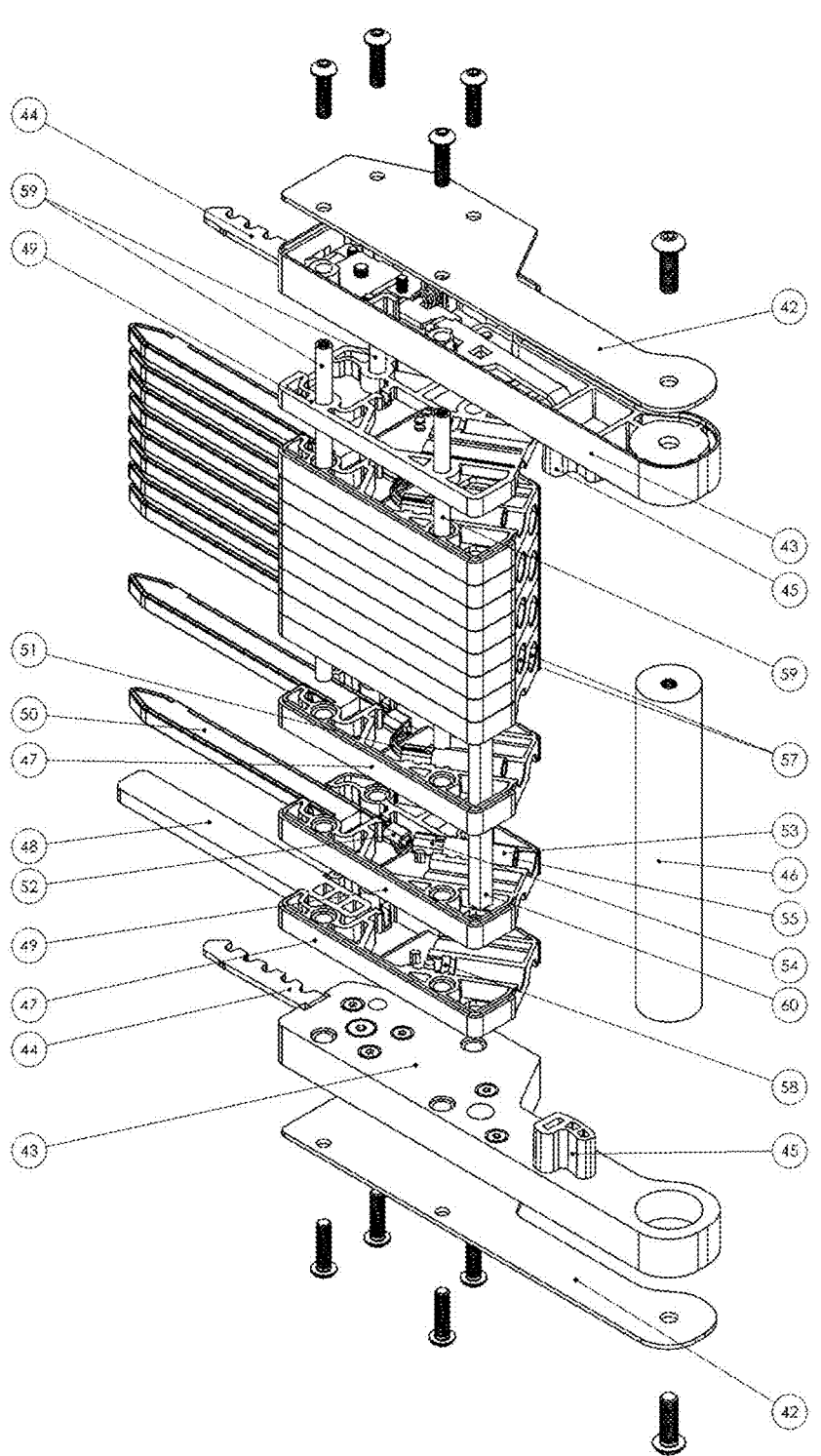
FIG. 7 Exploded view of the paddle assembly, showing its modular containers, the paddle guide, the insulating housing for the cylindrical terminal, the flexible tooth, the ratchet and trigger mechanisms, and the arrangement of the handle FIG. 7A. Enlarged view of the insulating housing for the cylindrical terminal inside the dielectric window, showing the internal centering reliefs and the assembly of the tooth, the copper strand, and the metal clip.
Figure 7A:
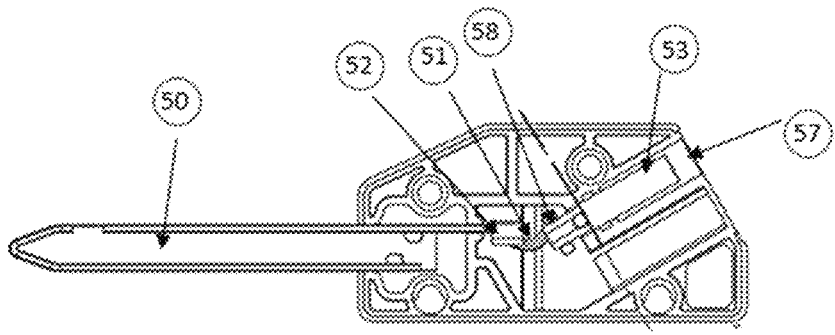
FIG. 7B. Enlarged lateral view of the same housing, highlighting the internal position of the terminal and its physical separation from the outer surface of the container.
Figure 7B:
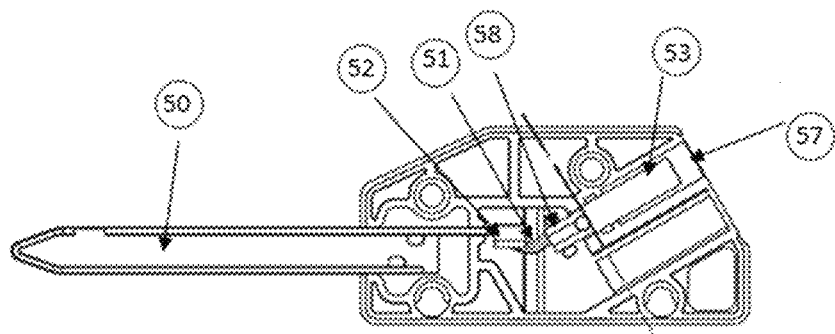

In accordance with FIG. 7, the assembly of the paddle is formed by a metal cover (42) fastened by screws to the paddle-base container (43), which houses the ratchet mechanism (44)—the linear ratchet teeth that prevent forward or backward movement while the locking bolt (5) is engaged in a notch—and the end of the handle (46). A paddle-A container (47) is stacked on top of the paddle-base container (43), and a paddle-B container (49) is stacked on top of the paddle-A container (47), together forming the chamber that houses and secures the guide (48). The first electrical signal is composed of a tooth (50) joined by a flexible copper cable (51) and a copper clip (52) to a conductive cylindrical terminal (53). This cylindrical terminal (53) is completely housed within the dielectric window (57) of the corresponding container, and its position is maintained by the internal centering reliefs (58). The geometry of the window (57) and the reliefs (58) ensures that the conductive body of the terminal (53) remains separated from the external surface accessible to the user, thereby providing the required electrical isolation. The terminal (53) includes an internal end (54) that serves as the attachment point for the flexible cable (51), and an external end (55) arranged to receive a banana-type connector. The paddle-A containers (47) and paddle-B containers (49) alternate sequentially to house multiple signals, from 2 up to 36, according to the number of signals in the corresponding block. The final closure of the assembly is achieved using an upper paddle-B container (49) and an opposite paddle-base container (43), which houses a second ratchet mechanism (44) and trigger (45). Finally, the metal cover (42) is fastened by screws to protect the internal mechanisms, while the handle (46) is lodged in the corresponding cavity of the paddle-base container (43). The complete assembly is secured by internal threaded tubes (59) and screws that compress the metal covers (42). A square bar (60), shown in FIG. 8, connects both triggers (45) and enables their simultaneous operation.

FIGS. 7-A and 7-B show an enlarged view of the assembly formed by the tooth (50), the flexible copper cable (51), the copper clip (52), and the cylindrical terminal (53). In this configuration, the cylindrical terminal (53) is housed entirely within the window (57) of the corresponding container. The window (57) includes internal centering reliefs (58) that keep the terminal (53) positioned at the center of the cylindrical cavity, ensuring its stable position during operation. The arrangement of the dielectric window (57) and the reliefs (58) keep the conductive body of the terminal separated from the outer surfaces accessible to the user, allowing the complete accommodation of the assembly within the container. The tooth (50), the flexible cable (51), and the clip (52) maintain their structural alignment with the cylindrical terminal (53), which receives a banana-type connector at its external end (55). The internal end (54) serves as the attachment point for the clip (52).

Within the assembly shown in FIG. 7, the paddle-base container (43) incorporates the structure that supports the internal mechanism of the paddle and guides its movement within the overall assembly. This support consists of the paddle-base container (43), the metal covers (42), and the threaded tubes (59) that secure and guide the paddle, the preferred implementation being the paddle-base container (43) itself, the metal covers (42) fastened by screws, and the internally threaded tubes (59) that pass through the modules and ensure cohesion of the assembly. The arrangement of these elements keeps the ratchet mechanisms (44) and triggers (45) properly aligned, allowing the paddle to move in a controlled manner within the containers and ensuring structural stability during insertion and extraction operations.

Anchor Insurance

Figure 8:
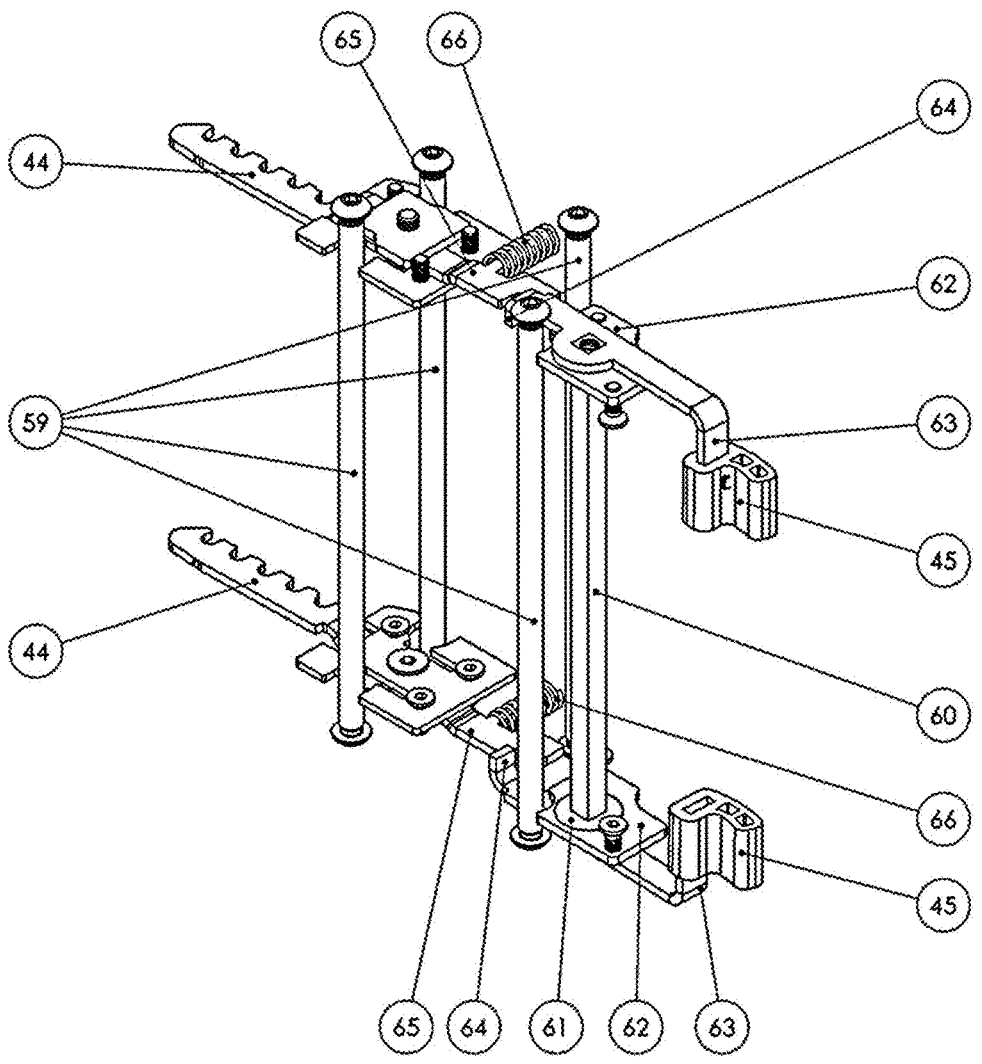
FIG. 8 Exploded view of the ratchet and trigger mechanism located at both ends of the paddle, showing the square bar, friction discs, levers, and the elements that provide sequential advancement.

FIG. 8 shows the general arrangement of the paddle assembly at its base, including the mechanical elements that allow the paddle to advance in discrete steps and remain locked in each intermediate position. It refers to the linear ratchet mechanism (44) coupled to the locking bolt (5), which enables step-by-step advancement of the paddle. The ratchets are toothed arms (44) located at opposite ends of the paddle and are arranged to engage the locking bolt (5) mounted on the block (FIG. 1). Each ratchet arm (44) includes a series of teeth or recesses that define intermediate detent positions. As the paddle advances, the bolt (5) enters these recesses successively, preventing forward or backward movement until the ratchet is released. The release of the ratchet is performed by the manual triggers (45) located at each end of the paddle. The triggers (45) are mechanically coupled by the square bar (60), which ensures simultaneous actuation. Each trigger (45) rotates around a common pivot and acts upon the ratchet arm to temporarily separate it from the bolt (5), allowing the paddle to advance to the next step. The mechanism is biased by a helical spring (66) housed in the paddle-base container (43), which returns both the ratchet and the trigger to their resting positions after actuation. The cooperation between the ratchet (44), the locking bolt (5), the trigger (45), the spring (66), and the square bar (60) provides controlled stepwise insertion, manual release at each step, and bidirectional locking. This bidirectional locking is achieved by the geometry of the ratchet teeth, which prevents movement in either direction while the bolt is engaged in a recess, permitting only discrete steps.

FIG. 8-A shows a detailed view of the interaction between the ratchet's toothed arm (44) and the manual trigger (45). The toothed ratchet arm (44) rotates around the pivot axis (69). Activation of the manual trigger (45) causes the square bar (60), together with the friction disc (61), to rotate to release the ratchet (44). The ratchet includes a guide surface (67) that maintains alignment with the locking bolt (5), and a cam surface (68) that receives the force applied by the trigger during actuation. When the trigger (45) is pressed, its power arm acts against the cam surface (68), causing the ratchet (44) to rotate away from the locking bolt (5). This rotation momentarily lifts the ratchet recess away from the bolt, allowing the paddle to advance to the next step. The helical spring (66) provides the restoring force that returns both elements to their resting positions.

The invention claimed is:

1. A multipolar auxiliary testing device for electrical instruments comprising:
   a modular set of dielectric containers housing electrical contacts configured to interrupt control and potential signals, and short-circuit and interrupt current signals between a primary electrical system and associated measuring, control or protection instruments, the device including rear screw terminals and a front frame with windows for insertion of a test blade (paddle);
   wherein each current-signal contact assembly comprises a primary-side terminal, an instrument-side terminal, a flexible conductor, and an independent short-circuit arm configured to engage a rigid conductive short-circuit bridge bar prior to separation of the main contacts;
   wherein all contact terminals are biased toward the paddle corridor by torsion springs that maintain mechanical and electrical engagement with the paddle tooth profile until displaced;
   wherein the dielectric containers include dielectric walls defining independent insulating chambers dimensioned to provide at least 2500-V insulation between adjacent poles;
   the paddle is inserted in discrete linear steps by linear ratchet elements formed by ratchet teeth engageable with a locking bolt mounted in the block;
   manual trigger levers, mechanically coupled by a square rod extending across the paddle, are configured to release each discrete step by disengaging the corresponding ratchet tooth from the locking bolt; and
   the ratchet elements include bidirectional locking teeth configured to prevent forward or reverse movement of the paddle while the locking bolt remains engaged within a ratchet slot.

2. The multipolar auxiliary testing device of claim 1, wherein each contact terminal includes a bimetallic rivet comprising a silver head defining the contact surface and a rivet shank extending through the terminal, the shank being secured by a deformed closing head that mechanically anchors the rivet within the copper terminal.

3. The device of claim 1, wherein the paddle comprises alternating paddle-A and paddle-B container modules defining cavities for housing signal teeth, each signal tooth being connected by the flexible conductor to a cylindrical terminal that is completely contained within an insulating window and centered by internal reliefs, the cylindrical terminal being configured to receive a banana-type external connector.

4. The multipolar auxiliary testing device of claim 1, wherein the paddle includes alternating modules forming cavities for housing signal teeth, each tooth being connected by the flexible conductor to a cylindrical terminal fully contained within an insulating window and centered by internal relief features, the terminal being configured to receive a banana-type connector.

5. The device of claim 1, wherein sequential insertion and anchoring of the paddle is produced by linear ratchet elements whose ratchet teeth define bidirectional locking engagement with the locking bolt, and release of each discrete step is provided by manual trigger levers mounted on both ends of the paddle and mechanically coupled by a square rod.

6. The device of claim 1, wherein each current-signal assembly includes an independent short-circuit arm having a U-shaped geometry mounted on an embedded pivot pin, the arm being biased by the torsion spring and configured to perform a combined linear and rotational movement toward the short-circuit bridge bar such that the short-circuit occurs prior to opening of the main current terminals.

\* \* \* \* \*